United States Patent [19]

Dreves et al.

[11] 4,261,095
[45] Apr. 14, 1981

[54] SELF ALIGNED SCHOTTKY GUARD RING

[75] Inventors: Richard F. Dreves, Westford; John F. Fresia, Shelburne; Sang U. Kim; John J. Lajza, Jr., both of Essex Junction, all of Vt.

[73] Assignee: International Business Machines Corporation, Armonk, N.Y.

[21] Appl. No.: 968,052

[22] Filed: Dec. 11, 1978

[51] Int. Cl.³ .......................................... H01L 21/28
[52] U.S. Cl. ........................................ 29/571; 29/578; 29/579; 29/590; 357/15; 357/52
[58] Field of Search ................. 29/579, 578, 590, 571; 357/15, 52

[56] References Cited

U.S. PATENT DOCUMENTS

| | | | |
|---|---|---|---|
| 3,616,380 | 10/1971 | Lepselter | 204/164 |
| 3,742,315 | 6/1973 | Iizuka et al. | 357/15 |
| 3,752,702 | 8/1973 | Iizuka et al. | 156/647 X |
| 3,763,408 | 10/1973 | Kano et al. | 357/15 |
| 4,026,740 | 5/1977 | Owen | 29/580 |
| 4,063,964 | 12/1977 | Peressini et al. | 148/1.5 |

OTHER PUBLICATIONS

Neues Aus Der Technik, Feb. 1, 1972, No. 1.
IBM Technical Disclosure Bulletin, vol. 12, No. 7, Dec. 1969, p. 1057.
IBM Technical Disclosure Bulletin, vol. 19, No. 11, Apr. 1977, pp. 4089 and 4090.

*Primary Examiner*—G. Ozaki
*Attorney, Agent, or Firm*—Francis J. Thornton

[57] ABSTRACT

A method of forming a self aligned guard ring surrounding a schottky barrier diode device without requiring an enlargement of the final schottky barrier device. The method involves creating an overhanging opening in a insulator layer overlying a semiconductor body to expose the schottky contact area on the surface of the semiconductor body, depositing a diffusion barrier material such as molybdenum in the opening, the deposit being of the same size as the smallest part of the overhanging opening so that a guard ring can be formed from a vapor by diffusion around the deposited barrier material.

1 Claim, 7 Drawing Figures

SELF ALIGNED SCHOTTKY GUARD RING

DESCRIPTION

1. Technical Field

The present invention relates to Schottky barrier devices and more particularly to a method of forming a Schottky barrier device with a guard ring surrounding the device.

2. Description of the Prior Art

When a metal is brought into intimate contact with a semiconductor surface the resulting metallic semiconductor interface exhibits current rectifying characteristics. Such an interface is commonly referred to as a Schottky barrier device and acts in a similar fashion to a p-n semiconductor junction and provides a number of qualities desirable for integrated circuit applications.

Such Schottky barrier devices are well known and have been extensively reported and utilized. The use of the guard ring surrounding Schottky barrier devices has been reported for example, in U.S. Pat. No. 4,063,964 in which ion implantation is utilized to form a guard ring surrounding the Schottky barrier device. Other guard ring forming techniques are also shown in U.S. Pat. Nos. 3,961,350 and 3,616,380.

It has also been proposed to form Schottky barrier semiconductor devices in which a undercut is provided around the metal forming the Schottky barrier junction with the semiconductor so as to create an enclosed space encircling the junction beneath an insulator formed on the surface of the semiconductor to improve the breakdown voltage characteristics of the semiconductor. Devices typical of this construction are shown in U.S. Pat. Nos. 3,763,408 and 3,752,702.

SUMMARY OF THE PRESENT INVENTION

In accordance with the present invention there is provided a method for producing a guard ring surrounding the periphery of a Schottky barrier device which uses a minimum of semiconductor surface area. This is accomplished by utilizing a physical characteristic resulting from the formation of a etched overhanging opening through an insulator formed on the surface of the semiconductor body. Such an overhang may be formed by etching through a dual layer insulator in which the underlying insulating layer etches at a faster rate, than the upper insulating layer. This differential etching of the underlying layer of the dual insulator produces an overhanging upper layer of the dual insulator such that when a diffusion barrier material is deposited say by evaporation or sputtering through the opening in the upper insulator a narrow annulus or ring of exposed silicon around the barrier material is created. This deposit of barrier material may now be used in conjunction with the insulator on the surface of the semiconductor body to cause vapor diffusion to occur only in the annulus of exposed silicon around the deposit. Thus there is created a Schottky barrier diode with a guard ring without enlargement of diode area.

BRIEF DESCRIPTION OF THE PREFERRED EMBODIMENTS

Figure 1A:
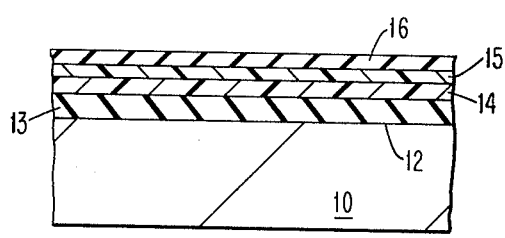
FIGS. 1A to 1G are sectional views of one form of the present invention in various stages of its manufacture.

Referring now to the FIGS. and especially to FIG. 1A a wafer of N type conductivity having a resistivity of about 1 to 2 ohm-cm in a thickness of 8-16 mils is used as the starting substrate 10. The substrate 10 is a monocrystalline structure which can be fabricated by conventional techniques. Although the present invention concerns Schottky barrier devices, it should be understood that these devices would be formed on the semiconductor wafer together with a multiplicity of other types and numbers of semiconductor devices, both passive and active, such as transistors, resistors and capacitors. For simplicity in the drawings and ease of illustration these other devices are not shown in the drawings. The surface 12 of the semiconductor body 10 is cleaned and there is formed on the surface 12, a 5000 angstroms thick layer of silicon dioxide 13. This silicon dioxide layer 13 can be produced by any number of processes. In one such process the semiconductor body is heated to about 1000° C. in a oxygen atmosphere and containing a small amount of water. Following the establishment of the silicon dioxide layer 13, a layer of silicon nitride 14 having a thickness of about 500 angstroms is formed over the layer 13. In practice this layer 14 can range in thickness between 250 angstroms and 2500 angstroms. One particular method of forming this silicon nitride layer 14 known to the semiconductor art comprises a treatment in which silane and ammonia are mixed in a carrier gas of hydrogen and introduced into a chamber containing the silicon body 10 heated to a temperature of about 800° C. At this temperature a reaction occurs resulting in a formation of the silicon nitride layer 14 on the silicon dioxide layer 13. Following the creation of this silicon nitride layer 14 a 3000 thick angstrom layer of silicon dioxide is formed over the layer silicon nitride 14. This layer 15 of silicon dioxide assures a good base for the adhesion of any subsequent photoresist layers as well as an etch mask for the silicon nitride. Preferably, this second layer of silicon dioxide 15 is formed by pyrolytic deposition at about 800° C.

Figure 1E:
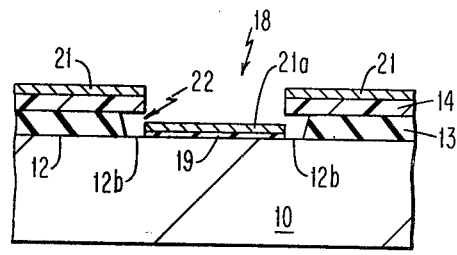
Figure 1B:
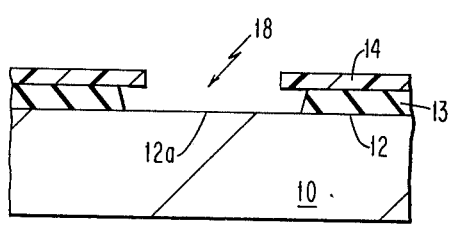

Once all of these various layers of selective materials have been deposited on the surface 12 of the semiconductor body 10 in the required thicknesses and order as set forth above, a photoresist layer 16 is provided over the entire surface of oxide layer 15 and exposed in accordance with well known techniques to permit the opening of window 18 in the photoresist layer 16. This window 18 in the photoresist layer is used to define the region of the underlying silicon dioxide and silicon nitride layers 13, 14 and 15 that must be etched through to expose the region of surface 12 of the body of the semiconductor material 10 in which the Schottky diode is to be made. Removal of the silicon dioxide, silicon nitride layers 13, 14 and 15 in the region 18 is accomplished by using known etching techniques. The outermost layer of silicon dioxide 15 in the window area is removed by dipping the photoresist coated body in a solution of buffered hydrofluoric acid. This acid solution removes the portion of layer 15 underlying the window 18 as shown in FIG. 1B. When layer 15 is etched through, the device is removed from the hydrofluoric acid solution. A hot phosphoric acid solution is now used to open the window through the silicon nitride layer 14 which has been exposed by the removal of silicon dioxide layer 15 underlying the window 18. This hot phosphoric acid solution will also destroy the photoresist layer 16. However, since the photoresist layer 16 is no longer necessary its removal is immaterial.

Once the silicon nitride layer 14 has been etched away in the window region 18 the exposed portion of layer of silicon dioxide 13 is removed by again placing the device in a buffered hydrofluoric acid solution. This buffered hydrofluoric acid solution penetrates through the window 18 in the silicon nitride layer 14 to disolve away the underlying silicon dioxide layer 13 in the region of the window 18 and simultaneously etches the upper most layer of silicon dioxide 15.

When the buffered hydrofluoric acid penetrates through the window 18 in the silicon nitride layer 14, the underlying silicon dioxide layer 13 is etched away not only straight down beneath the window 18 but also etched sideways so as to slightly undercut the silicon nitride layer. The distance that this slight undercutting penetrates beneath the silicon nitride layer is equal to the thickness of the silicon dioxide layer 13, thus if the layer 13 is 1000 A° thick the amount of undercut to each side of the window area in the nitride layer 14 will also be about 1000 A°. This occurs because the solution attacks in all directions in the window 18. Thus when layer 13 has been etched through an area 12a of surface 12 is exposed in the window area.

The silicon nitride 14 will overhang the edges of this exposed silicon area 12a as well as the edges of the underlying silicon oxide layer 13 as shown in FIG. 1B.

Once all the layers have been etched through and the semiconductor surface 12a is exposed in the region of window 18, as shown in FIG. 1B, a thin deposit of silicon dioxide 19 less than 100 angstroms in thickness is formed on the exposed surface 12a in the opening 18. Because the silicon dioxide is formed by a vapor treatment, it will expand under the overhanging silicon nitride lip and cover the entire exposed surface 12a in the region of window 18.

Following the creation of a thin silicon dioxide layer 19 a diffusion barrier material 21 such as a 500 angstroms thick layer of molybdenum or other refractory metal is deposited by a line of sight deposition method for example by evaporation. Because this deposit is so created in a line of sight operation it will be deposited over the entire unit as layer 21. However, because of the overhanging silicon nitride lip, the portion of the deposit in the window indicated as 21a is limited to the size of the opening in the silicon nitride layer 14 and thus does not cover the entire surface of the silicon oxide layer 19. This is shown in FIG. 1D. It should be particularly noted that the thickness of the underlying silicon dioxide layer 19 and the deposit of molybdenum 21a, formed in the region of the window 18 together must not equal the thickness of the deposited silicon dioxide layer 13. Because of this and because of the overhanging silicon nitride layer there exists a gap 22 between the upper surface of deposit 21a and the edge of the oxide 13 and the edge of the overhanging silicon nitride layer 14.

Once the molybdenum layer has been deposited the unit is again submerged in a buffered hydrofluoric acid which penetrates the gap 22 and dissolves away the silicon dioxide layer 19 between the perimeter of the polybdenum deposit 21a in the window region 18 and the prematurely etched opening in silicon dioxide layer 13. Because the devices are subjected to the buffered hydrofluoric acid solution only long enough to remove the exposed portion of the thin silicon dioxide layer 19, which is approximately 100 angstroms in thickness, only the exposed portion of layer 19 is removed and the silicon dioxide layer 13 remains substantially untouched. This etching away of the exposed portion of silicon dioxide layer 19 exposes a thin ring 12b of the surface of the body 10 around the molybdenum deposit 21a. Thus the molybdenum deposit 21a and the remaining oxide 19 now appear as an isolated island as shown in FIG. 1E. For selected processes or temperatures this oxide removal may be unnecessary.

Figure 1F:
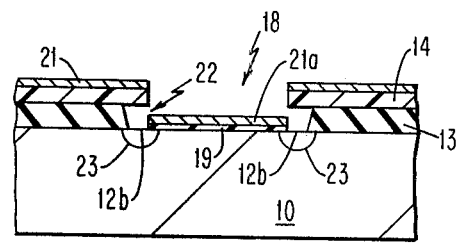
Figure 1C:
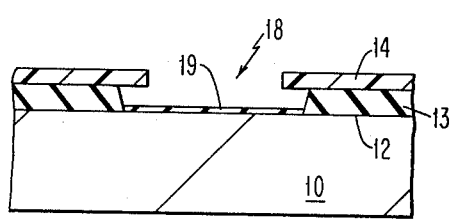
Figure 1G:
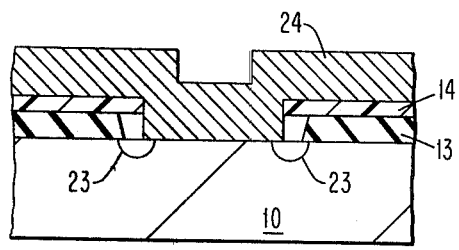
Figure 1D:
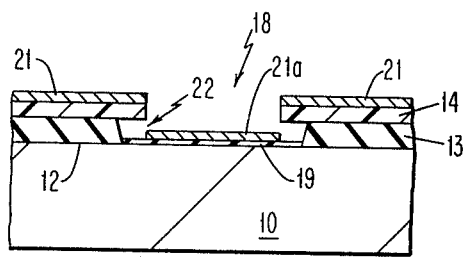

The device is now heated and subjected to a vapor of a suitable diffusant to create a guard ring 23 beneath the exposed ring 12b of the silicon surface 12 around the molybdenum layer 21a as shown in FIG. 1F. The diffusant would be made of any suitable material such as, arsenic, phosphorus or boron etc., depending on the type material of the semiconductor body. The diffusant goes through the gap 22 and penetrates into the silicon body 10 only under the exposed ring 12b of the surface of the body 10. Because the silicon nitride layer 14 the thick oxide layer 13 and the molybdenum deposit 21a all act as diffusion barriers no doping of the body 10 occurs except under the exposed ring 12b.

Once the guard ring has been diffused into the body the molybdenum layer 21 and especially the deposit 21a is removed by a suitable acid solution which attacks only the molybdenum. Such a solution would be for example, hydrochloric acid. Once the molybdenum layer has been everywhere removed, the thin underlying silicon dioxide layer 19 is also removed by dipping the unit in a solution of buffered hydrofluoric acid.

Once the molybdenum layer 21 and the silicon dioxide layer 19 has been removed from the surface 12a of the body 10, in the window 18 a layer of metal 24 such as aluminum, about 10,000 angstroms in thickness, which will form with the silicon body 10 Schottky barrier diode contact, is then deposited over the body. The metal layer 24 may be deposited by any of the conventional techniques such as evaporation, etc. The resulting structure is heated in a neutral atmosphere sufficient to sinter the metal and form the Schottky contact between the aluminum layer 24 and the silicon body 10 where it is in contact with the exposed portion of the body 10 surface. The Schottky barrier diode formed, by this heating, is in the center of the guard ring 23 formed by the diffusion. Thus, a complete small Schottky barrier device has been created with a diffused guard ring without utilizing additional increased area or as required in the prior art.

While the invention has been particularly described with reference to the perferred embodiment thereof it will be understood by those skilled in the art that the foregoing and other changes in form and details be made therein without departing from the spirit and scope of the invention.

What is claimed is:

1. A method of forming a schottky barrier diode and guard ring in a silicon body of a first conductivity type comprising;
   cleaning the surface of the silicon body,
   thermally growing a first layer of silicon dioxide approximately 5000 angstroms thick on the surface of the body,
   forming a layer of silicon nitride between 250 angstroms and 2500 angstroms thick on the first layer of silicon dioxide,
   defining an opening in said layers to expose a selected portion of the silicon surface with the opening in the silicon nitride layer being smaller than the opening in the silicon dioxide layer such that the silicon nitride layer overhangs the opening in the silicon dioxide layer, pyrolytically depositing a second silicon dioxide layer less than 100 angstroms thick on the entire exposed surface of said silicon body, the second silicon dioxide layer being thinner than the first silicon dioxide layer, evaporating a refractory metal deposit approximately 500 angstoms thick on a selected portion of said second silicon dioxide layer, said refractory metal deposit being the same size as the opening in the silicon nitride material and smaller than the opening in the first layer of silicon dioxide and smaller than the second silicon dioxide layer, etching away the second silicon dioxide material around the refractory metal deposit to expose an annular region on the surface of the underlying silicon body around the refractory metal deposit, diffusing an impurity of second conductivity type into the exposed annular silicon surface to create a guard ring in the body, around the perimeter of the refractory metal deposit of a conductivity type different from that of said body, removing the refractory metal deposit and the remainder of the second silicon dioxide layer from said silicon surface, depositing a Schottky barrier forming metal on the exposed surface within the perimeter of the diffused guard ring, heating said silicon body and said Schottky barrier forming metal to fuse said Schottky barrier forming metal with said silicon body to form a Schottky barrier diode within said guard ring, and forming electrical contacts to said body and to said Schottky barrier forming metal.

* * * * *